(12) United States Patent
Schomacker et al.

(10) Patent No.: US 11,994,890 B2
(45) Date of Patent: May 28, 2024

(54) DETERMINING INFORMATION REGARDING A CONNECTION OF A CIRCUIT COMPONENT

(71) Applicant: Infineon Technologies AG, Neubiberg (DE)

(72) Inventors: Ronny Andreas Schomacker, Gratwein (AT); Markus Huemer, Graz (AT); Christoph Schertz, Frohnleiten (AT)

(73) Assignee: Infineon Technologies AG, Neubiberg (DE)

(*) Notice: Subject to any disclaimer, the term of this patent is extended or adjusted under 35 U.S.C. 154(b) by 57 days.

(21) Appl. No.: 17/505,006

(22) Filed: Oct. 19, 2021

(65) Prior Publication Data

US 2022/0129025 A1 Apr. 28, 2022

(30) Foreign Application Priority Data

Oct. 28, 2020 (DE) .......................... 102020213559.2

(51) Int. Cl.
*G05F 1/575* (2006.01)
*G05F 1/59* (2006.01)
(Continued)

(52) U.S. Cl.
CPC ............... *G05F 1/575* (2013.01); *G05F 1/59* (2013.01); *G05F 1/614* (2013.01); *H03M 1/124* (2013.01)

(58) Field of Classification Search
CPC ..... G05F 1/00; G05F 1/10; G05F 1/12; G05F 1/46; G05F 1/455; G05F 1/45;
(Continued)

(56) References Cited

U.S. PATENT DOCUMENTS 4,594,633 A * 6/1986 Townsend ............... G05F 1/569
361/57
5,880,589 A 3/1999 Okano
(Continued)

FOREIGN PATENT DOCUMENTS

| DE | 10361676 A1 | 6/2005 |
|---|---|---|
| DE | 102016225645 A1 | 6/2017 |
| EP | 2434363 B1 | 5/2013 |

*Primary Examiner* — Thienvu V Tran
*Assistant Examiner* — Nusrat Quddus
(74) *Attorney, Agent, or Firm* — Harrity & Harrity, LLP (57) ABSTRACT

The present disclosure describes a device for determining information regarding a connection of a circuit component that is connected to an output of a regulator in order to reduce fluctuations of an output signal at the output of the regulator. The device includes a processing unit that is configured to generate a statistical value that is a measure of fluctuations of the measurement signals, and thus of the output signal at the output of the regulator, based on a plurality of measurement signals, each of which has information regarding the output signal of the regulator and is recorded while a load component generates an electrical load at the output of the regulator. The processing unit is configured to compare the statistical value with a limit value and to determine the information regarding the connection of the circuit component based on the result of the comparison.

27 Claims, 6 Drawing Sheets

(51) Int. Cl.
*G05F 1/614* (2006.01)
*H03M 1/12* (2006.01)

(58) Field of Classification Search
CPC ... G05F 1/445; G05F 1/66; G05F 1/40; G05F 1/42; G05F 1/44; G05F 1/462; G05F 1/52; G05F 1/56; G05F 3/10; G05F 3/16; G05F 3/18; G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; G05F 1/30; G05F 1/33; G05F 1/32; G05F 1/34; G05F 1/38; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/158; H02M 3/1588; H02M 2003/1566; H02M 3/1582; H02M 2003/1557; H02M 3/07; H02M 3/073; H02M 7/10; H02M 7/103; H02M 7/106; H02M 1/088; H02M 2003/071; H02M 2003/072; H02M 2003/075; H02M 2003/076; H02M 2003/077; H02M 2003/078; H02M 2001/007; H02M 2001/0048; H02M 1/12; H02M 3/3155; H02M 3/33507; H02M 3/33546; H02M 7/1557; H02M 7/1626; H02M 1/4208; H02M 7/53871; H02M 7/219; H02M 7/151; H02M 1/4233; H02M 5/4585; H02M 7/217; H02M 1/08; H02M 7/1552; H02M 7/1623; H02M 1/4225; H02M 3/33592; H02M 3/137; H02M 7/00; H02M 7/06; H02M 7/064; H02M 7/068; H02M 1/32; H02M 2001/322; H02M 2001/327; H02M 1/34; H02M 2001/342; H02M 2001/344; H02M 2001/346; H02M 2001/348; H02M 1/36; H02M 1/38; H02M 1/42; H02M 1/4216; H02M 1/4241; H02M 1/425; H02M 1/4258; H02M 1/4266; H02M 2001/4275; H02M 2001/4283; H02M 2001/4291; H05B 39/048; B23K 11/24; H04B 2215/069; H02J 7/12; G01R 19/165; G01R 19/16504; G01R 19/16509; G01R 19/16514; G01R 19/16519; G01R 19/16523; G01R 19/16528; G01R 19/16533; G01R 19/16538; G01R 19/16542; G01R 19/16547; G01R 19/16552; G01R 19/16557; G01R 19/16561; G01R 19/16566; G01R 19/16571; G01R 19/16576; G01R 19/1658; G01R 19/16585; G01R 19/1659; G01R 19/16595; G01R 19/17

See application file for complete search history.

(56) References Cited

U.S. PATENT DOCUMENTS

| | | | | |
|---|---|---|---|---|
| 5,926,384 | A * | 7/1999 | Jochum | H02M 3/1584 363/39 |
| 6,075,378 | A | 6/2000 | Okamura | |
| 7,009,545 | B2 | 3/2006 | Cho et al. | |
| 9,356,517 | B1 * | 5/2016 | Ihs | H02M 3/158 |
| 9,490,725 | B2 * | 11/2016 | Xia | H02M 7/25 |
| 9,500,686 | B1 | 11/2016 | Wilson et al. | |
| 9,536,517 | B2 * | 1/2017 | Williams | G10L 15/01 |
| 9,601,997 | B2 * | 3/2017 | Yan | H02M 3/157 |
| 10,224,813 | B2 * | 3/2019 | Kudva | H02M 3/156 |
| 10,243,524 | B2 * | 3/2019 | Orr | G05F 1/575 |
| 10,525,780 | B2 | 1/2020 | McKellar et al. | |
| 11,606,028 | B2 * | 3/2023 | Prodic | H03K 5/24 |
| 2007/0041145 | A1 | 2/2007 | Losehand | |
| 2009/0112493 | A1 | 4/2009 | Abdennadher et al. | |
| 2010/0164443 | A1 * | 7/2010 | Tumminaro | H02M 3/33507 323/284 |
| 2010/0177538 | A1 | 7/2010 | Scherr | |
| 2010/0283438 | A1 * | 11/2010 | Chung | G05F 1/575 323/268 |
| 2011/0115520 | A1 | 5/2011 | Horsky et al. | |
| 2013/0162289 | A1 * | 6/2013 | Mangattur | H03K 19/1732 326/38 |
| 2013/0314101 | A1 * | 11/2013 | Belet | G05F 1/46 324/548 |
| 2014/0002044 | A1 * | 1/2014 | Babazadeh | H02M 3/1588 323/282 |
| 2014/0049239 | A1 * | 2/2014 | Labbe | H02M 3/156 323/282 |
| 2014/0152339 | A1 * | 6/2014 | Mora Sanchez | G01R 31/40 324/764.01 |
| 2014/0347028 | A1 * | 11/2014 | Jayaraj | H02M 3/1588 323/282 |
| 2015/0180326 | A1 * | 6/2015 | Motojima | H02M 1/32 323/282 |
| 2017/0023429 | A1 * | 1/2017 | Straeussnigg | H03M 3/462 |
| 2017/0102418 | A1 | 4/2017 | Tumati et al. | |
| 2017/0133927 | A1 * | 5/2017 | Almukhtar | H02M 3/156 |
| 2017/0279358 | A1 * | 9/2017 | Kobayashi | G01R 31/40 |
| 2017/0285679 | A1 * | 10/2017 | Szczeszynski | H02M 3/07 |
| 2018/0097444 | A1 * | 4/2018 | Low | H02M 1/32 |
| 2020/0059158 | A1 * | 2/2020 | Toni | H02M 3/07 |
| 2020/0073424 | A1 * | 3/2020 | Sakaguchi | G05F 1/575 |
| 2020/0160958 | A1 * | 5/2020 | Huser | G16H 50/20 |
| 2021/0006147 | A1 * | 1/2021 | Feldtkeller | H02M 1/083 |
| 2021/0050781 | A1 * | 2/2021 | Prodic | G01R 19/14 |
| 2022/0334150 | A1 * | 10/2022 | Muehlschlegel | H05B 45/3725 |

\* cited by examiner

DETERMINING INFORMATION REGARDING A CONNECTION OF A CIRCUIT COMPONENT

RELATED APPLICATION

This application claims priority to German Patent Application No. 102020213559.2, filed on Oct. 28, 2020.

FIELD

The present disclosure relates to devices and methods for determining information regarding a connection of a circuit component. The present disclosure further relates to devices and methods for detecting missing external capacitors of regulated voltage sources.

BACKGROUND

In many applications, smooth and error-free operation is only ensured when the connection of the individual circuit parts or circuit components of the application is correct.

Analogue/digital conversion is an example of this. Voltage measurements by means of an analogue/digital converter can depend on a stable reference voltage. As a rule, this reference voltage originates from the output of a voltage regulator. The regulator itself can be buffered by a capacitor (with an external or integrated capacitor), in order to avoid fluctuation of the regulator, for example if the regulator is loaded by an electrical consumer, for example by the beginning of an analogue/digital conversion. In the presence of a faulty connection of the capacitor, a change in the reference voltage can result when the regulator is loaded, as a result of which the analogue/digital conversion delivers an incorrect result. This can lead to problems, in particular in relation to the evaluation of the result of the analogue/digital conversion in safety-critical applications.

A product for tire pressure monitoring provides an example of such an application. An appropriate product can, for example, comprise an ASIC and two capacitors, while in the final application the ASIC is externally connected to two capacitors. With current products, a verification of the correct connection of the two capacitors is, for example, carried out by a working test on the part of the customer with an external, wired measurement on the product circuit board. The product can, however, no longer be tested during its service life, since it is located inside a tire.

SUMMARY

The inventors have noted that until now solutions for monitoring circuit components have some disadvantages, for example in respect of the costs for tests and the possibility of monitoring during the service life of the component, in particular in applications in which the circuit component can only be accessed with difficulty, if at all. There is therefore a need for an improved concept that makes it possible to obtain information regarding a connection of a circuit component, for example in particular in the context of safety-critical applications in which monitoring throughout the service life is advantageous or even necessary.

Examples according to the present disclosure create a device for determining information regarding a connection of a circuit component that is connected to an output of a regulator in order to reduce fluctuations of an output signal at the output of the regulator. The device comprises a processing unit that is designed to generate a statistical value that is a measure of fluctuations of the measurement signals, and thus of the output signal at the output of the regulator, based on a plurality of measurement signals, each of which has information regarding the output signal of the regulator, and is recorded while a load component generates an electrical load at the output of the regulator. In addition to this, the processing unit is designed to compare the statistical value with a limit value and to determine the information regarding the connection of the circuit component based on the result of the comparison.

Further examples according to the present disclosure create a method for determining information regarding a connection of a circuit component that is connected to an output of a regulator in order to reduce fluctuations of an output signal at the output of the regulator. The method comprises generating an electrical load at the output of the regulator and generating a statistical value based on a plurality of measurement signals, each of which has information regarding the output signal of the regulator, and is recorded while the electrical load at the output of the regulator is generated. The statistical value here is a measure of fluctuations of the measurement signals and thus of the output signal at the output of the regulator. The method further comprises comparing the statistical value with a limit value, and determining the information regarding the connection of the circuit component based on the result of the comparison.

Examples according to the present disclosure are based on the recognition that information regarding a connection of a circuit component can be determined through comparing a statistical value that is based on a plurality of measurement signals with a limit value. The circuit component is connected here to an output of a regulator in order to reduce fluctuations of an output signal at the output of the regulator. The plurality of measurement signals comprise information regarding the output signal of the regulator and, through the connection of the circuit component to the output of the regulator, also regarding the connection. The plurality of measurement signals are recorded here while a load component generates an electrical load at the output of the regulator. Conclusions can thus be drawn regarding the connection of the circuit component from the behaviour of the output signal of the regulator. If the circuit component is, for example, correctly connected, then, for example, fluctuation of the output signal of the regulator can be prevented by the circuit component even during the electrical load, whereas in the case of a faulty connection, or even of a missing circuit component, fluctuations in the output signal of the regulator can arise. The behaviour of the output signal can, in turn, be taken into consideration by the plurality of measurement signals for generating the statistical value, which in turn is then a measure for the fluctuations of the measurement signals and thus of the output signal at the output of the regulator. A conclusion as to the state of the connection of the circuit component can, for example, be drawn using a limit value determined beforehand.

A concept according to the disclosure can, for example, be integrated here into existing systems with little effort, for example without additional hardware, but simply through extending the functionality of existing circuit elements. According to the disclosure it is not essential that an external measurement of the circuit component is carried out, but, with existing sensors for acquiring the regulator output, information regarding the connection of the circuit component can, for example, be determined instead from the information that is already present by generating the statistical value. The additional functionality of calculating the statistical value and of the comparison can, for example, be accommodated in an existing ASIC. Such an extension of an existing system can in this way be economical, and be advantageous, above all, for example, in safety-critical applications. Through the concept according to the disclosure, monitoring is possible through the service life of the system even when, for example in the case of a tire pressure sensor, this is itself no longer accessible in the application, for example for an external measurement of the circuit components. In one implementation, the load component can be designed with, for example, particularly little effort, to acquire the plurality of measurement signals, wherein the measurement process itself generates the electrical load through the load component at the output of the regulator.

Differentiated information regarding a degradation of the connection of the circuit component can be acquired from the comparison of the statistical value with one or a plurality of limit values, for example using a multi-stage comparison. Information regarding a remaining service life of the device can be obtained through prior tests, for example for applications in tough environments, from the statistical limit value or values.

The circuit component can be a buffer capacitor that is connected to the output of a voltage regulator. In such a case, determining information regarding the connection of the buffer capacitor can provide the evidence of a good ohmic connection between the two components. The load component can be an analogue/digital converter that, through the measurement of the regulated voltage of the voltage regulator, simultaneously creates the load at the output of the regulator. The statistical value can here be a standard deviation or a variance that is generated from the plurality of measurement signals of the analogue/digital converter measurements. The evidence of a good ohmic connection can in turn follow from the evaluation of the standard deviation or variance. In the event of a missing buffer capacitor, which, for example, results in a high-resistance connection, the associated regulator of the buffer capacitor can start to fluctuate during the measurement, whereby the regulator can become unstable. Such a fluctuation or instability can then in turn be recognized at the standard deviation or variance in order to enable a conclusion to be drawn regarding the connection of the buffer capacitor.

BRIEF DESCRIPTION OF THE DRAWINGS

Examples according to the present disclosure are explained in more detail below, making reference to the appended figures. With regard to the schematic figures shown, it is to be pointed out that the function blocks shown are to be understood both as elements or features of the device according to the disclosure as well as corresponding method steps of the method according to the disclosure, and that corresponding method steps of the method according to the disclosure can also be derived therefrom. In the figures.

DETAILED DESCRIPTION

Before examples of the present disclosure are explained in more detail below based on the drawings, it is to be pointed out that elements, objects and/or structures in the different figures that are identical or that have the same effect are given the same or similar reference signs, so that the description of these elements given in the different examples can be exchanged with one another or applied to one another.

Figure 1:
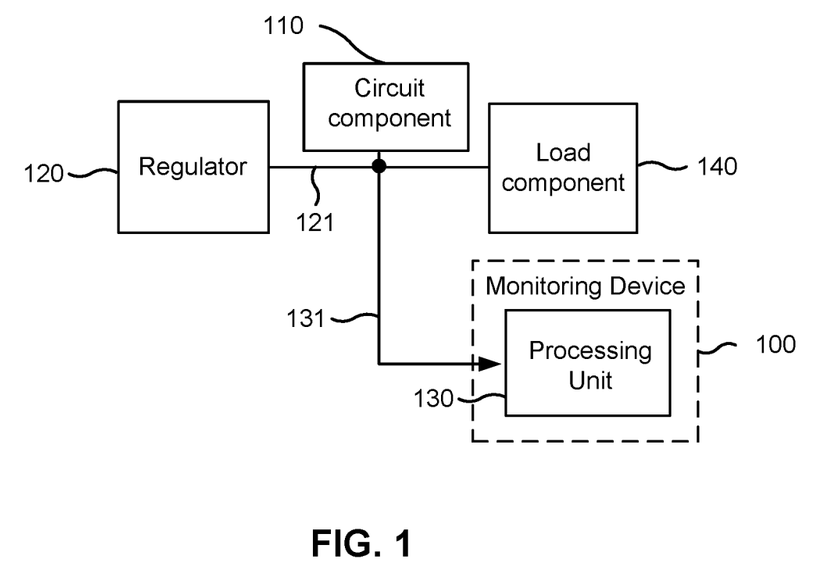
FIG. 1 shows a schematic block diagram of an example of a device according to the present disclosure.

FIG. 1 shows a schematic block diagram of an example of a device according to the present disclosure. FIG. 1 shows a device 100 for determining information regarding a connection of a circuit component 110. The circuit component 110 is connected to an output of a regulator 120 in order to reduce fluctuations of an output signal 121 at the output of the regulator. FIG. 1 further shows a processing unit 130 that has a connection 131 to the output signal 121, and a load component 140, wherein the load component is coupled to the regulator 120.

The processing unit 130 may be comprised of one or more processors, digital signal processors, processing circuits, or a combination thereof. The processing unit 130 is designed to generate a statistical value based on a plurality of measurement signals. The plurality of measurement signals each comprise information regarding the output signal 121 of the regulator 120. Through the plurality of measurement signals, information regarding the output signal 121 of the regulator 120 is thus available to the processing unit 130, as is indicated in FIG. 1 by the connection 131.

It is to be pointed out here that the connection 131 is only intended to indicate a flow of information regarding the output signal 121 of the regulator 120 to the processing unit 130. Such a connection can, for example, in particular be routed through further blocks, or have further intermediate elements.

The plurality of measurement signals are, furthermore, recorded while the load component 140 generates an electrical load at the output of the regulator 120. By generating the electrical load a tendency for the output signal of the regulator 122 to fluctuate can be reinforced, for example in the case of a faulty connection of the circuit component 110 to the output of the regulator 120, so that the faulty connection can be recognized by means of the statistical value that is generated by the processing unit 130 based on the plurality of measurement signals. In examples the processing unit can be designed to generate the statistical value based on a plurality of 10 or more, 50 or more, or 100 or more measurement signals, i.e. measurement values, in order to generate a reliable statistical value.

In order, for example, to recognize the state of the connection, the processing unit 130 is designed to compare the statistical value with a limit value and to determine the information regarding the connection of the circuit component 110 based on the comparison. Such a limit value can be determined beforehand from series of measurements or preliminary tests. The statistical value can, furthermore, also be compared with a plurality of limit values in order to generate differentiated information, for example regarding the state of the connection of the circuit component 110. In, for example, a corrosive environment, a degradation of the connection can in this way be monitored in individual steps, and, for example, a servicing or exchange can be planned.

Since the circuit component 110 should reduce the fluctuations of the output signal 121 of the regulator 120, it can, for example, have capacitive or integrating system properties, or can also represent a delay element.

The determination of the information regarding the connection of the circuit component 110 can form an additional functionality for monitoring in the context of an overall circuit into which the device is, for example, integrated. In these cases, for example, the load component 140 can be a further circuit element that is, for example, designed for the primary functionality or further functionality of the overall circuit. In the case of a sensor, the load component 140 can, for example, be designed to provide or prepare a sensor measurement value with the aid of the output signal 121 of the regulator 120. The electrical load can therefore be a load that is caused, for example, by the sensor operation of the overall circuit that is occurring, and is not necessarily an additional load component. A concept according to the disclosure can therefore, for example, particularly advantageously be integrated into existing systems, for example through the synergetic utilization of existing loads at the outputs of regulators, for example with only the integration of an additional processing unit 130 or the integration of the functionality of the processing unit 130 into an existing circuit component such as an ASIC.

The plurality of measurement signals can, furthermore, be analogue or digital signals. In the case, for example, of analogue processing of the signals, the connection 131 in FIG. 1 can be a direct, for example wired, connection between the output of the regulator 120 and the processing unit 130. Alternatively, for example in the case of digital processing of the plurality of measurement signals, the connection 131 can be indirectly implemented, for example, through coupling via an analogue/digital converter. The connection 131 can, in particular, be realized through the load component 140 to the processing unit 130, for example in connection with a digitizing component arranged in the load component 140.

In further examples according to the present disclosure, the processing unit is designed to receive the plurality of measurement signals after (e.g., immediately after or in response to) the load generated by the load component has changed.

By receiving the plurality of measurement signals after a change in the generated load, information regarding the damping behavior of the output signal of the regulator can advantageously be determined. If the circuit component is missing, or in the case of a faulty connection, a change in the load can reinforce a tendency of the output signal to fluctuate, and thus lead to better measurement accuracy in terms of the information regarding the connection of the circuit component. In this way, for example, even small deviations from an ideal state of the connection can be acquired. In examples, a change in the load can be carried out before a measurement signal is acquired, so that each measurement signal is acquired after a separate load change. The measurement signal can in each case be acquired after a certain time following the change in the load. In alternative examples, several or all of the measurement signals can be recorded at different times following the same change in the load.

In further examples according to the present disclosure, the load component comprises an analogue/digital converter.

Using an analogue/digital converter can have particular advantages in respect of the effort and costs for integration. In particular, an analogue/digital converter, the reference input of which is connected to the regulator output, can be used on the one hand to acquire the plurality of measurement signals, as well as to generate the electrical load at the output of the regulator, for example by loading the regulator output by the measurement for acquiring the measurement signals. In this way the functionality for determining the information regarding the connection of the circuit component can be implemented with little hardware effort. Using an analogue/digital converter furthermore enables the generation of a dynamic load at the output of the regulator, so that the sensitivity of the determination of the information regarding the connection of the circuit component can be improved. This can occur through a reinforcement of a tendency for the output signal to fluctuate, for example by switching the analogue/digital converter on and off multiple times, in order in this way to start and stop a measurement multiple times and thus to generate a varying load.

In examples according to the present disclosure, the processing unit is designed to receive output signals of the analogue/digital converter as the plurality of measurement signals.

By evaluating the output signals of the analogue/digital converter, an economical, digital and easily integrable processing for determining the information regarding the connection of the circuit component can be enabled, for example in comparison with analogue signal processing.

Examples according to the present disclosure comprise an interface that is designed to output the information regarding the connection of the circuit component.

The interface can, for example, be an interface for wireless information transfer, so that even in the case of an integrated system that is also, for example, difficult to access, information regarding the connection of the circuit component of the system can be provided over the service life. A facility can thus, for example, be created by the interface for further processing the information regarding the connection outside the system. Alternatively, or in addition, a comparison or an evaluation of the statistical value, or also its calculation, can be outsourced by transferring the plurality of measurement signals via an interface to a further, external system.

In examples according to the present disclosure, the statistical value is a measure for a mean deviation of the measurement signals from a mean value (i.e., from an average or mean) of the measurement signals.

Such a calculation of the statistical value can, for example, be implemented with little computing effort and without placing high demands on the available hardware. Such a measure can at the same time enable meaningful information regarding the connection of the circuit component. The statistical value can, here, for example, be a central moment or an empirical central moment.

In examples according to the present disclosure, the statistical value is a standard deviation or a variance of the plurality of measurement signals or of the output signal of the analogue/digital converter. With a plurality of N measurement signals $x_i$, the variance $\sigma^2$ can be calculated from $$\sigma^2 = \frac{1}{N}\sum_{i=1}^{N}(x_i - \mu)^2,$$

wherein μ is the mean value according to $$\mu = \frac{1}{n}\sum_{i=1}^{n} x_i$$

The standard deviation σ can be calculated as the square root of the variance. Using a sample with n G N measurements of the plurality of measurement signals or of the output signal of the analogue/digital converter, furthermore, an empirical variance $s^2$, and thereby an empirical standard deviation, can be calculated, for example according to $$s^2 = \frac{1}{n-1}\sum_{i=1}^{n}(x_i - \overline{x})^2,$$

wherein $\overline{x}$ describes the empirical mean value according to $$\overline{x} = \frac{1}{n}\sum_{i=1}^{n} x_i.$$

By evaluating the standard deviation or the variance, a statistical, for example easily interpretable, possibility can be created for classifying fluctuations of the measurement signals, and thus of the output signal at the output of the regulator, and for determining information regarding the connection of the circuit component through a subsequent comparison with a limit value.

In examples according to the present disclosure, the processing unit is designed to determine a binary information item regarding the connection of the circuit component.

The binary information item can, for example, be a confirmation that the circuit component is connected, or a warning that the circuit component is not connected. For example, an output status can, for example for a user or customer, be "detected" or "not detected", based on the predefined pass/fail criterion. This type of information is very easy to determine, in particular in respect of a comparison with a limit value, for example by a representation of exceeding or falling below the limit value. A two-valued evaluation can, moreover, reduce the computing effort, and generate a result that is easily interpreted by a user.

Examples according to the present disclosure comprise a circuit device that comprises the previously described device, the regulator, the load component and the circuit component.

Such a circuit device can, for example, be entirely integrated into an application. The circuit device can, for this purpose, for example, be manufactured economically as a complete module, so that it can also be installed in safety-critical applications with the facility for monitoring the circuit component in accordance with the disclosure, for example without the need for external measurement interventions.

In examples according to the present disclosure, the circuit component has a capacitive property.

Capacitive circuit components, such as capacitors for example, are, for example, particularly suitable for stabilizing voltage sources or voltage regulators. Monitoring the connection of such a circuit component can therefore be of great significance for the operation of such a source or such a regulator.

In examples according to the present disclosure, the circuit component is a capacitor.

Capacitors are, for example, economical and very widespread components that are integrated into a large number of applications. The possibility of applying a method according to the disclosure for determining information regarding the connection of the capacitor can therefore entail advantages in a large number of applications.

In examples according to the present disclosure, the circuit device further comprises a sensor element that is designed to output a sensor signal, wherein the regulator is a voltage regulator that is designed to generate a regulated reference voltage, wherein the load component comprises an analogue/digital converter that is designed to receive the regulated reference voltage at a first input and to receive the sensor signal at a second input, and wherein the processing unit is designed to receive output signals of the analogue/digital converter as the plurality of measurement signals.

Due to this construction of the circuit device, the analogue/digital converter can, for example, be used, making use of the sensor signal, to provide further functionalities in addition to the determination according to the disclosure of the information regarding the circuit component. By means of the sensor element, a sensor signal that is, for example, a voltage, can be output in order to be processed into a digital signal in the analogue/digital converter using the regulated reference voltage. The information regarding the connection of the circuit component can again here be determined in accordance with the disclosure from the sensor signal and the regulated reference voltage, for example without involving further hardware. At the beginning of a measurement of the analogue/digital converter, or when switching the analogue/digital converter on and off multiple times in order to start and finish measurement processes multiple times, in the case, for example, of a faulty connection of the circuit component, the output signal, in the form of the regulated reference voltage, can begin to fluctuate, which can in turn be recognized by evaluating the output signal of the analogue/digital converter, which represents the plurality of measurement signals, by the processing unit.

By using the analogue/digital converter as a load element at the output of the regulator, an electrical load, for example a dynamic load, can be generated which in the case, for example, of a poor connection of the circuit component, leads to a fluctuation that leads to a large variance or standard deviation of the output signal of the analogue/digital converter. A fluctuation in the output signal of the regulator caused thereby can in this case be strong enough that such a fluctuation, for example in spite of a variable sensor signal, can be used to determine information regarding the circuit component. In this way, monitoring the circuit component in the course of operation without interrupting an additional sensor functionality of the sensor element is enabled. This in turn can offer great advantages, in particular in safety-relevant applications, if a safety-critical sensor measurement must not be interrupted.

In examples according to the present disclosure, the circuit device is implemented as an integrated circuit.

The concept according to the disclosure permits the implementation of the circuit device as an integrated circuit, which is, for example, advantageous in respect of the space requirement, for example in particular through the possibility of using existing hardware to determine the information regarding the circuit component and, at the same time, to carry out further application-specific functionalities. Through the embodiment as an integrated circuit, such a device can, for example, also be implemented in a particularly robust manner, for example encapsulated away from environmental influences.

In examples according to the present disclosure, the method comprises transmission of the information regarding the connection of the circuit component.

Through a transmission, for example wirelessly, of the information, the information can in the case of integrated devices be made accessible to a higher-level circuit or to a user.

Examples according to the present disclosure provide a computer program with program code for carrying out one of the previously described methods and concepts according to the disclosure when the program is executed on a computer.

The generation of the statistical value and comparison with the limit value can, for example, be carried out by a concept according to the disclosure with little computing effort, so that such a computing program with low additional effort can be carried out on a microprocessor or computer that is, for example, already present.

Figure 2:
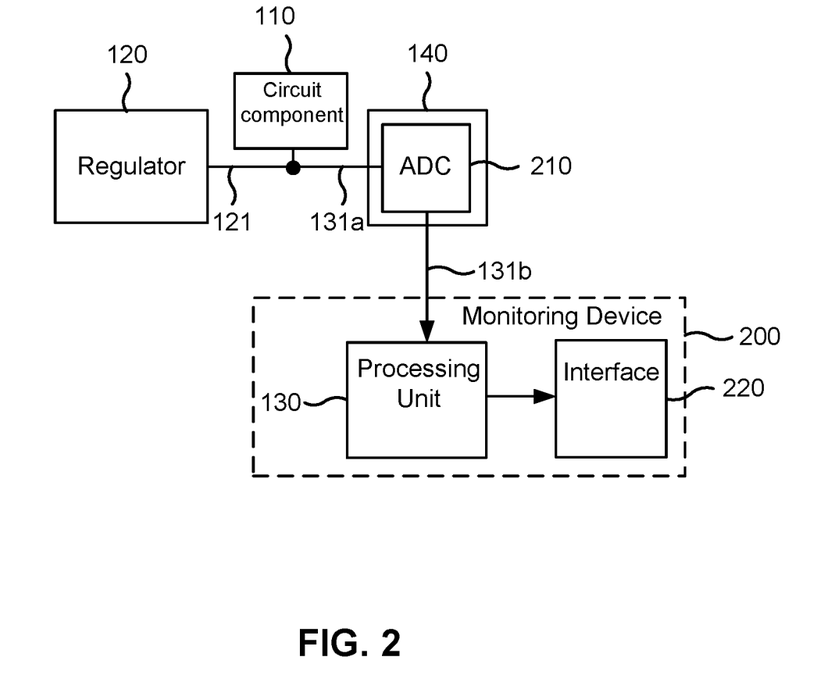
FIG. 2 shows a schematic block diagram of an example of a device with an interface according to the present disclosure.

FIG. 2 shows a schematic block diagram of an example of a device with an interface according to the present disclosure. In comparison with FIG. 1, the device 200 comprises in addition an interface 220 that is coupled to the processing unit 130. In addition to the rest of the arrangement according to FIG. 1, the load component 140 comprises an analogue/digital converter 210. The connection 131 that describes the flow of information provided by the plurality of measurement signals, from the output signal 121 of the regulator 120 to the processing unit 130, leads in FIG. 2 from the output signal 121 of the regulator 120 (the first part of the connection 131a) via the analogue/digital converter 210 to the processing unit 130 (second part of the connection 131b). The second part of the connection 131b here further comprises the output signal of the analogue/digital converter 120.

The processing unit 130 may be comprised of one or more processors, digital signal processors, processing circuits, or a combination thereof. The processing unit 130 can, for example, carry out digital signal processing by processing the output signal of the analogue/digital converter 210. The analogue/digital converter 210 can also be used to generate the electrical load at the output of the regulator 120 by starting and stopping measurements. In order, for example, to be able to generate particularly meaningful statistical values, the analogue/digital converter 210 can be switched off and on again after each measurement, so that in the case, for example, of a faulty connection of the circuit component 110, a fluctuation can be provoked through a change in the load, i.e. through dynamically changing the load.

A transmission of the information regarding the connection of the circuit component 110 can be enabled through the interface 220. In applications, in particular, in which there is no possibility during the service life of carrying out a direct measurement at the circuit component 110, the information regarding the connection of further processing elements can be made accessible through an interface 220 that is, for example, designed to enable wireless transmission. An interface 220 can, furthermore, be used for continuous and/or regular monitoring, in particular in safety-critical applications.

Figure 3:
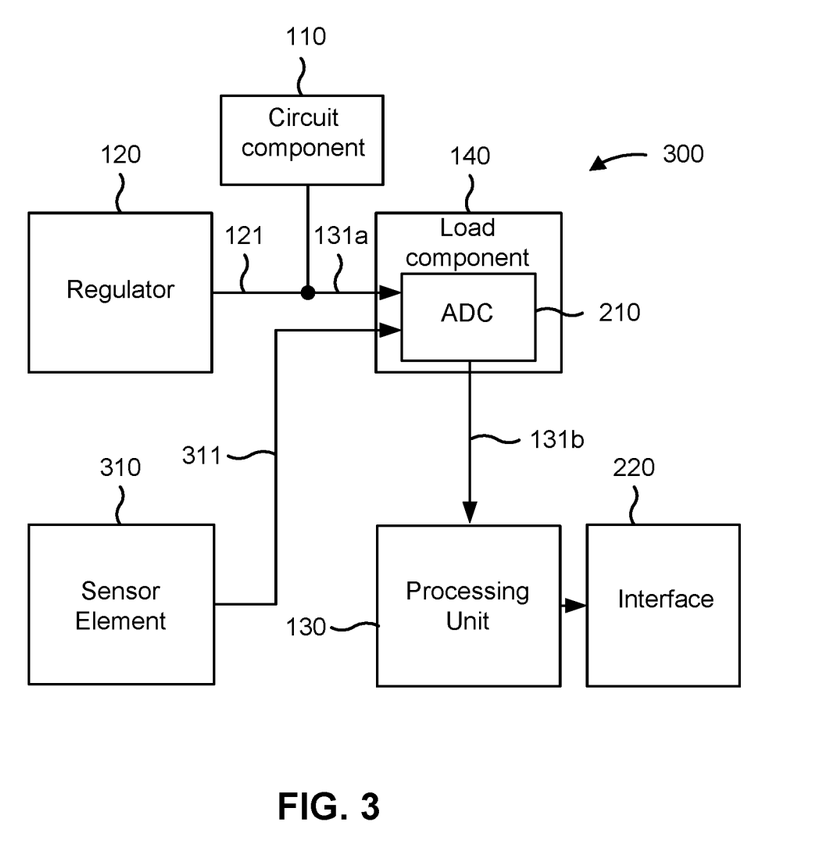
FIG. 3 shows a schematic block diagram of an example of a circuit device according to the present disclosure.

FIG. 3 shows a schematic block diagram of an example of a circuit device according to the present disclosure. The circuit device 300 comprises a sensor element 310 in addition to the circuit elements known from FIG. 2. A sensor signal 311 of the sensor element 310 is coupled to the analogue/digital converter 210.

In the circuit device 300, the circuit component 110 is a capacitive circuit component, for example a buffer capacitor. The regulator 120 here is a voltage regulator, and the output signal 121 of the regulator 120 is a regulated reference voltage. The sensor element outputs the sensor signal 311. The analogue/digital converter 210 further comprises two inputs, wherein the regulated reference voltage 121 is present at the first input and the sensor signal 311 at the second input. The processing unit 130 receives the output signal of the analogue/digital converter 210 via the connection 131b as the plurality of measurement signals.

The circuit device 300 can, for example, be a tire pressure sensor or part of such a sensor. A sensor signal 311 that is acquired from or at least output by the sensor element 310 is digitized for further processing by the analogue/digital converter 210. The regulated reference voltage 121 is, for example, present at the first input of the analogue/digital converter 210 for the digitization. The sensor signal 311 can, for example, be a measurement value that contains information regarding a tire pressure. The provision of information regarding the connection of the circuit component 110 can, in the case of the tire pressure, be of safety-critical significance. It may not, for example, be possible in ongoing operation, due to the integration of the circuit device 300 into a tire, to use external measurements to monitor the output signal 121, the tendency to fluctuation of which is reduced by the circuit component 110. At the same time, however, it can be advantageous or even necessary to monitor the correct analogue/digital conversion of the sensor signal 311. Through the determination according to the disclosure of information regarding the connection of the circuit component 110, therefore, information regarding the regulated reference voltage 121 can be generated, whereby, for example, an assessment of the reliability of an analogue/digital conversion of the sensor signal 311 can be enabled. The information can in turn be made available to external processing elements via the interface 220.

Integration according to the disclosure of the processing unit 130 and the interface 220 into existing hardware components, for example into an existing analogue/digital converter 210 and/or ASIC that is used for a further functionality of the circuit device 300, for example of a tire pressure sensor, can prove particularly advantageous. The analogue/digital converter 210, as already explained above, can be used, for example, to generate a dynamic load at the output of the regulator, whereby information regarding the regulated reference voltage 121, and thereby information regarding the connection of the circuit component 110 and thereby, again, information regarding, for example, the reliability of an analogue/digital conversion of the sensor signal 311 can be provided by the output signal of the analogue/digital converter 210 to the processing unit 130. The processing unit 130 itself can, for example, be integrated into an ASIC of the circuit device 300.

In examples according to the present disclosure, the load can be an analogue/digital converter, the regulator can be a voltage regulator, and the circuit component can be a buffer capacitor. The output signal of the voltage regulator is coupled to an input of the analogue/digital converter, and a reference voltage source is coupled to a further input of the analogue/digital converter (ADC). The reference voltage source can be a bandgap voltage source. Examples of the disclosure thus make it possible, using ADC measurements of a regulated voltage against a stable reference voltage, to verify the existence of a buffer capacitor or to verify whether the buffer capacitor is connected to the output of the voltage regulator.

Furthermore, connections of multiple circuit components to multiple regulated voltage sources can also be monitored, for example by switching the input variables of the analogue/digital converter by means of switches, so that a plurality of connections of circuit components can be monitored serially, in temporal sequence.

Concepts according to the disclosure, for example in particular the determination of the information regarding the connection of the circuit component, can be provided as firmware routines or firmware functions, for example for the customer. Concepts according to the disclosure or the firmware routines can exploit internally implemented hardware elements (e.g., analogue/digital converters), and thereby do not take up any additional space on a chip on which, for example, the device or the circuit device is implemented. Determining the information regarding the connection of the circuit component can, for example, be implemented as a test or self-test. The test itself can be reliable, and can be available throughout the service life of the product that, for example, contains the device or the circuit device, which can make concepts according to the disclosure interesting for ASIL (Automotive Safety Integrity Level) components with a high safety level that comprise a regulator or, for example, a regulated supply voltage.

Examples of the present disclosure enable a determination of the information regarding the connection of the buffer capacitor without having to switch off the regulated voltage of the voltage regulator that is being tested. This can thus also be available during the measurements for further functionalities of, for example, a measurement circuit. This can in particular entail great advantages for safety-critical applications in which an interruption of the measurement of the sensor signal is not possible. A measurement value for a tire pressure, for example, can thus continue to be acquired without interrupting the connection of the buffer capacitor for diagnostic purposes.

It is for that reason possible, for example for the case of a or the voltage regulator belonging to an "ASIL-*"-classified block, for concepts according to the present disclosure to be used for diagnostic functions.

Furthermore, costs, for example at a customer, for final product tests can be reduced by concepts according to the present disclosure. In current solutions, the customer requires an additional path or an additional contact on the circuit board of the product in order to be able to measure the output signal of the regulator, i.e., for example, the regulated voltage across the circuit component, for example the external capacitor. Such a path is not essential, or not necessary, due to concepts according to the present disclosure. Through the possibility of monitoring throughout the service life of the product, the customer's test before commencing operation can, for example, be entirely eliminated.

Examples thus make it possible to verify the existence of a buffer capacitor at the output of a voltage regulator. The measurement can be repeated multiple times, and variances and/or standard deviations can be calculated over all the repetitions or test results. The measurements can, for example, be carried out with a sufficient number of repetitions for the generation, for example, of meaningful variances and/or standard deviations. In the case of an intact connection of the buffer capacitor, or of a well-connected capacitor, the result, for example the standard deviation or the variance, can exhibit a very low value. Results of wafer tests show, in this case, a standard deviation of, for example $\sigma=3.3\%$. In the opposite case, for example in the case of a poor connection of the buffer capacitor, the result, for example the variance or the standard deviation, can be very high. Results of, for example, 10 trials, can in this case exhibit standard deviations of $\sigma>15\%$. In this way, a reliable pass/fail criterion, for example, can be made available in that a suitable limit value is chosen with which the variance or standard deviation is compared.

According to the present disclosure, this verification, i.e., for example, the test of whether a circuit component is correctly connected, is carried out internally, for example through the use of ASIC parts, and can, for example, be carried out whenever necessary throughout the service life of the product. Measurement results here are showing, for example, promising and reliable results. The information determined regarding the connection of the circuit component in an application can, for example in the case of the tire pressure sensor, be transmitted via a wireless interface to an electronic control unit of a vehicle, e.g., a motor car.

Figure 4A:
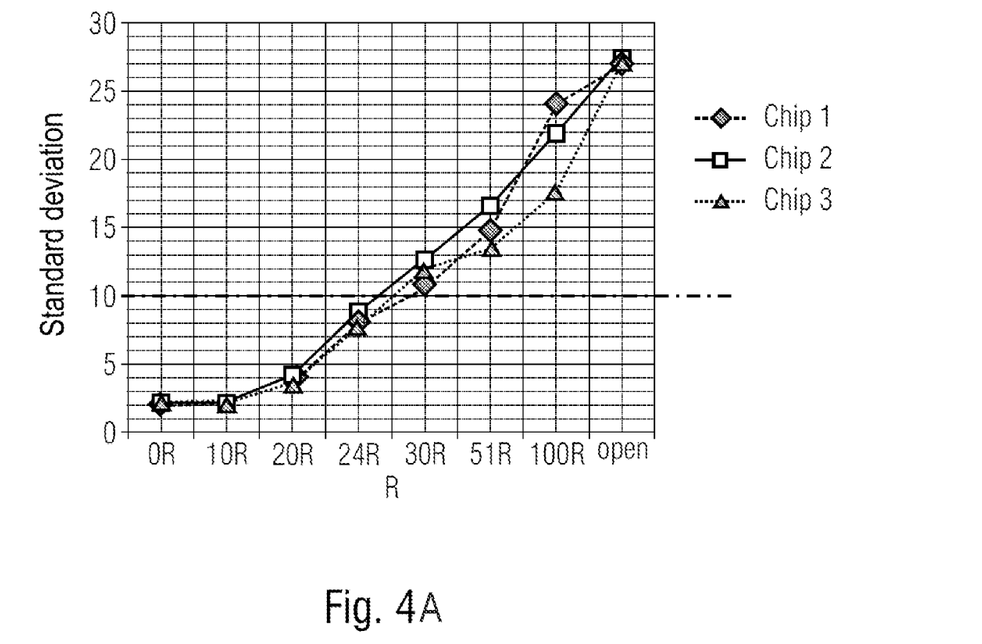
FIG. 4A shows a first diagram that illustrates standard deviations of measurement signals in the presence of a variation of the ohmic resistance of the connection of the circuit component.
Figure 4B:
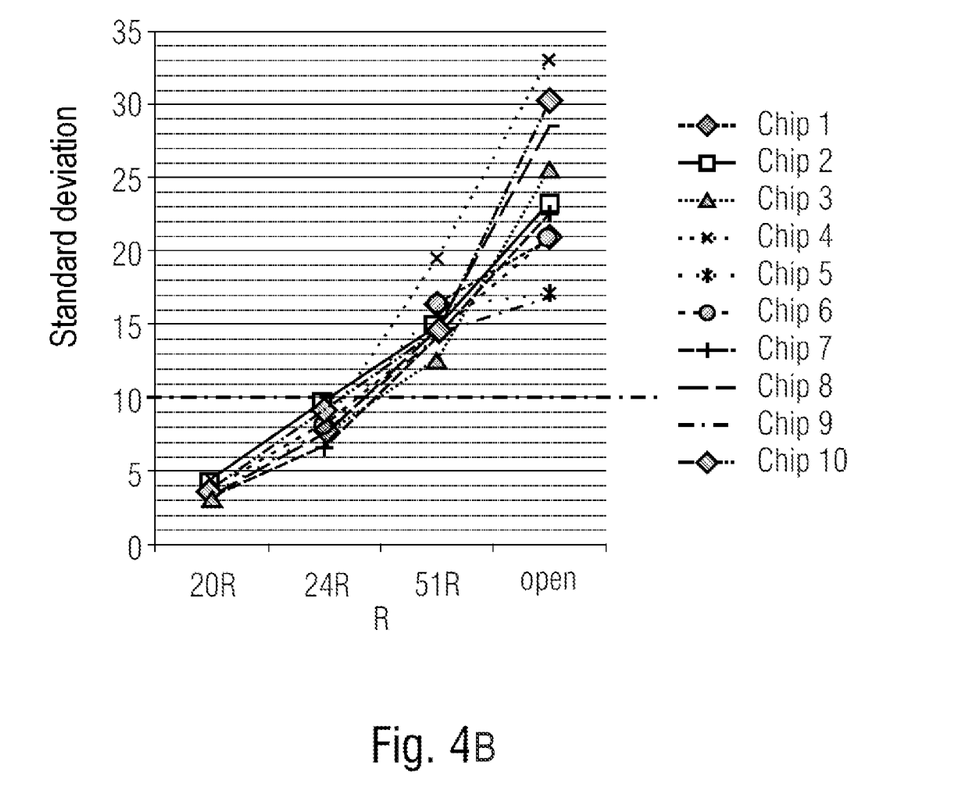
FIG. 4B shows a second diagram that illustrates standard deviations of measurement signals in the presence of a variation of the ohmic resistance of the connection of the circuit component.

FIGS. 4A and 4B show diagrams that illustrate standard deviations of measurement signals in the presence of a variation of the ohmic resistance of the connection of the circuit component. FIGS. 4A and 4B show or demonstrate the quality or the relationship of the ohmic connection between the output signal of the regulator, i.e., for example of the regulated voltage, and the circuit component, for example the capacitor. The worse the connection of the circuit component to the output of the regulator is, the greater is the ohmic resistance, for example, of this connection.

The standard deviation a of the plurality of measurement signals is plotted against the ohmic resistance of the connection of the circuit component for various tested chips. A clear rise in the standard deviation can be seen as the resistance of the connection increases. A limit value can therefore be specified, illustrated as dot-dash lines in FIGS. 4A and 4B by way of example at $\sigma_{GW}=10\%$. In the case, for example, of an ideal ohmic connection, for example with $R=0\Omega$, the standard deviation can be $\sigma<3\%$. For an ohmic connection, for example with $R>50\Omega$, the standard deviation can be $\sigma>10\%$.

Accordingly, it is possible, for example, by evaluating the standard deviation, to deduce a high ohmic resistance, or even an absence of the circuit component (R=open), and thus the state of the connection of the circuit component to the output of the regulator.

Examples of the present disclosure are based on the idea that the evidence of a "good" ohmic connection between the product which, for example, comprises an ASIC, and the circuit component, for example an external capacitor, or between the output of the regulator and the circuit component, can be demonstrated by evaluating the variance or standard deviation over a set of measurements of an analogue/digital converter/test sensor or sensor element. The tested voltage, or the output signal of the regulator that is connected to the circuit component, can be passed internally to the analogue/digital converter and processed by analogue/digital conversion. In the case of a missing circuit component, for example of a missing capacitor, which can lead to a high-resistance connection, the associated regulator can begin to fluctuate during the conversion, which can lead to unstable results. By recording the set of analogue/digital converter acquisitions, for example of 100 samples, fluctuations of the regulator can become visible through the sampled variance/standard deviation.

Figure 5:
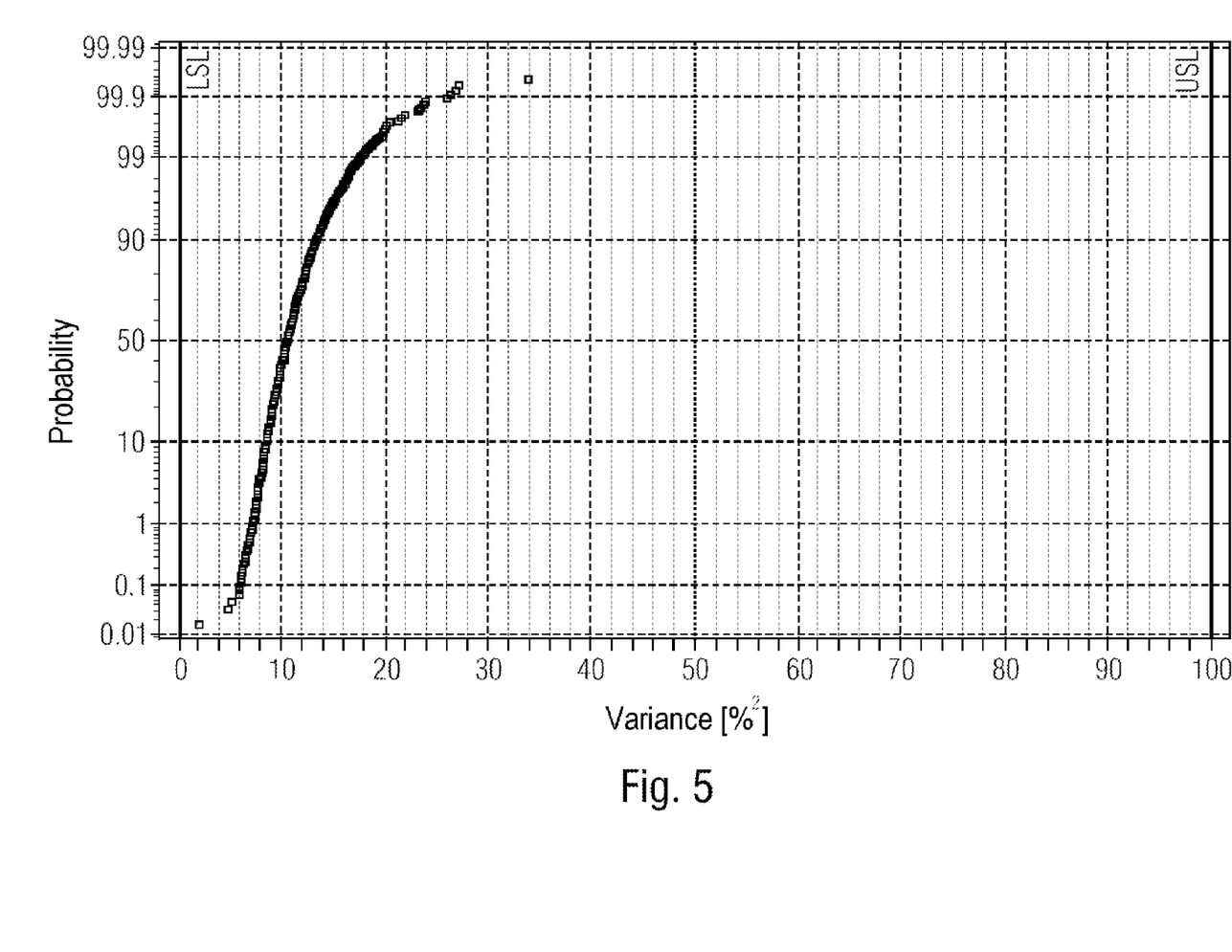
FIG. 5 shows a diagram that illustrates a probability density function of the variance for a test at wafer level.

FIG. 5 shows a diagram that illustrates a probability density function of the variance for a test at wafer level. FIG.

5 shows an evaluation of the probabilities of the variances in the case of a "positive" test, that is to say a test with a well-connected circuit component in the form of capacitors (10 nF) at wafer level, with more than 5000 tested chips. The variance was calculated in each case over 100 measurements of the analogue/digital converter. The calculation is carried out here by a firmware function. FIG. 5 shows an average variance of approximately 11%$^2$ and an average standard deviation of regarding 3.3%. The yield in this case was 99.97%.

FIG. 5 shows that in the case of the good connection of the capacitors, a limit value for the variance can be determined, for example using preliminary tests, which can enable a verification of the good connection in the application. It is possible, for example, with a choice of a lower specification limit (LSL) and an upper specification limit (USL), to specify a range for the variance within which the variance of the measurement signals of a circuit device has a high probability of lying when a corresponding capacitor of the circuit device is connected correctly or properly. The upper specification limit for the variance $\sigma_{USL}^2=100\%^2$ entered corresponds here to the limit value for the standard deviation $\sigma_{GW}=\sigma_{USL}$ plotted previously in FIGS. 4A and 4B. A smaller interval for the variance can alternatively be selected by choosing a variance of $\sigma_{USL,2}^2=50\%^2$ (the vertical line in FIG. 5 between LSL and USL). With, for example, a relationship between the variance of the measurement signals and the quality of the connection of the circuit component, different limit values can be used to divide circuit devices into various quality classes or to monitor the quality of the connection throughout the service life of the circuit device.

Figure 6:
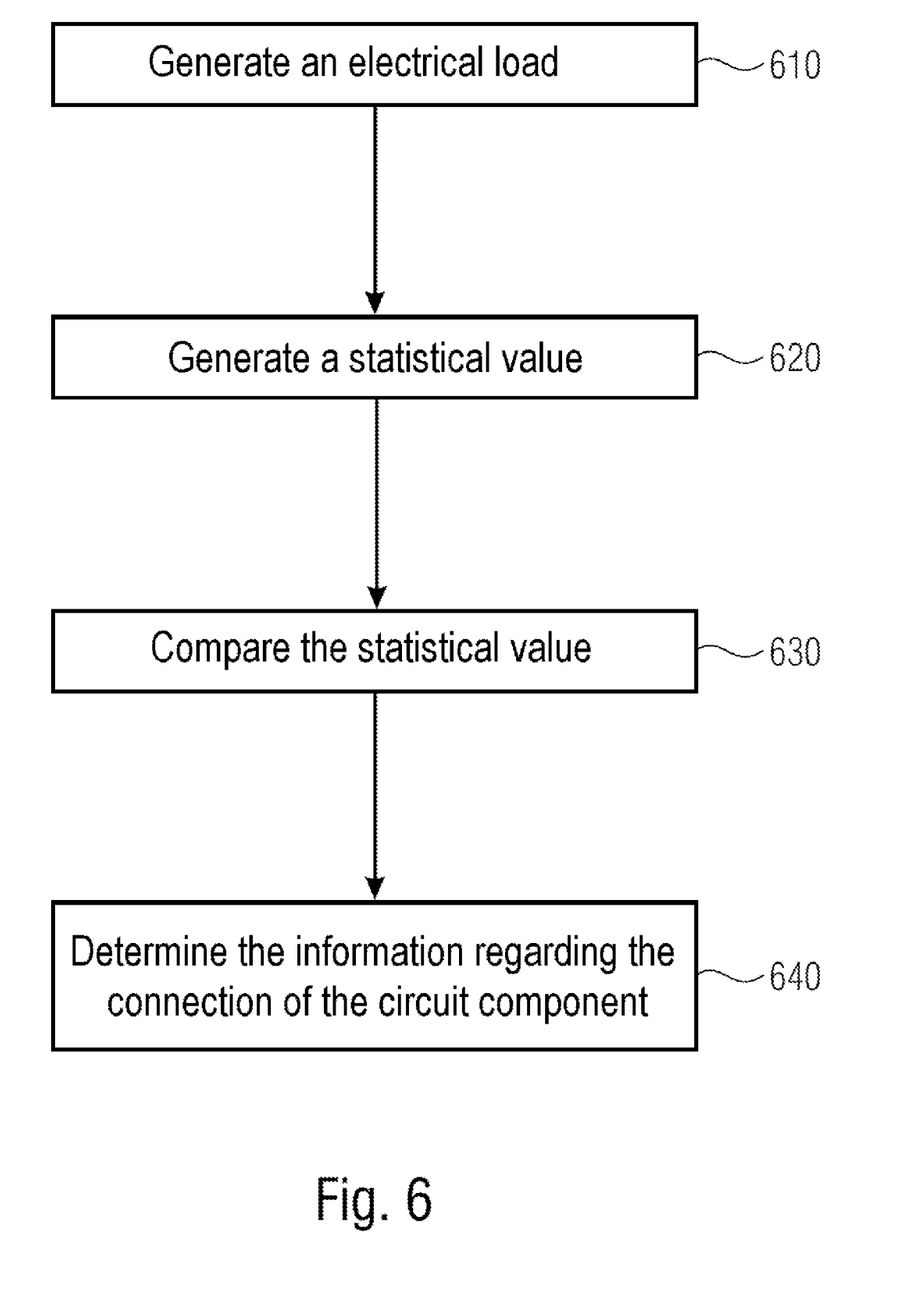
FIG. 6 shows a flow diagram of an example of a method according to the present disclosure.

FIG. 6 shows a flow diagram of an example of a method according to the present disclosure. Step 610 comprises creation of an electrical load at the output of the regulator. The electrical load at the output of the regulator can, for example, involve the measurement of an analogue/digital converter or loads from further circuit elements that cause a consumption of current that loads the output of the regulator. The load here can in particular be generated dynamically, for example by switching the analogue/digital converter on and off, or by causing a dynamic current profile, i.e., for example, changing over time, of a further circuit element that loads the regulator. A fluctuation at the output of the regulator in the presence of a faulty connection of the circuit component to the output of the regulator can thus, for example, be provoked.

Step 620 comprises generation of a statistical value based on a plurality of measurement signals, each of which comprises information regarding the output signal of the regulator, and is recorded while the electrical load at the output of the regulator is generated, wherein the statistical value is a measure of the fluctuations of the measurement signal and thus of the output signal at the output of the regulator. The plurality of measurement signals can here, for example, be used by the method according to the disclosure in an analogue manner through directly accessing the output signal of the regulator, or in a digital manner as the output signal of an analogue/digital converter of the load component. An advantageous embodiment of the method can, for example, be implemented using the analogue/digital converter on the one hand as a load component and also as an element that provides the plurality of measurement signals for the processing unit. By calculating the statistical value, for example in the form of a standard deviation or a variance, a numerical measure can be created with which fluctuations of the measurement signals, and thus of the output signal at the output of the regulator, can be described.

Step 630 comprises comparing the statistical value with a limit value, and step 640 determining the information regarding the connection of the circuit component based on the result of the comparison. According, for example, to the relationship according to FIGS. 4A and 4B, the statistical value, as a measure for the fluctuations of the output signal, can enable conclusions to be drawn regarding the ohmic connection of the circuit component, for example of the capacitor. The state of the connection of the circuit component can be determined by comparing with a limit value determined, for example, beforehand.

Examples according to the present disclosure furthermore create devices and methods for determining information regarding a connection of a circuit component for use in the field of the automobile industry, for example in conformity with safety standards such as, for example, the Functional Safety Standard ISO-26262.

Quite generally, examples according to the present disclosure create an integrated test for verification of the existence of external capacitors. Advantages here can be the reduction of test time and test costs for the customer since, for example, explicitly testing the device, circuit device or circuit component before being used in the application, for example making use of special pads for contacting, or contacts, can be omitted. A concept according to the disclosure can, furthermore, also be used for detecting "good" ohmic connections to other external equipment or devices. The concept according to the disclosure can, moreover, have particular advantages in ASIL-x systems as a safety mechanism, for example through the possibility of determining information regarding the connection of a circuit component throughout the entire service life of a product, in particular when the circuit component is used for safety-critical functionality.

Examples according to the present disclosure comprise a voltage regulator, one or a plurality of external capacitors, and an analogue/digital converter. In the case of a missing capacitor, repeated analogue/digital converter measurements can be carried out, in which the analogue/digital converter is switched on and off multiple times, for example to generate a dynamic load at the output of the voltage regulator. The set of analogue/digital converter measurements generated in this way can be evaluated in terms of their variance or standard deviation. Such a device or circuit device according to the disclosure can be favorable, or can entail cost advantages, for example because the analogue/digital converter can be used both as a load/consuming unit as well as for the detection of the capacitor.

Quite generally, examples according to the present disclosure enable determination of information, independent of temperature, regarding a circuit component that is connected to an output of the regulator.

Examples according to the present disclosure provide an integrated test for verification of the existence of correctly connected external capacitors to regulated voltage sources. Instead of wired, capacitive measurements, an integrated pass/fail detection of the capacitors can be implemented by a concept according to the disclosure.

In the examples, the processing unit can be implemented by means of any appropriate circuit structures, for example microprocessor circuits, ASIC circuits, CMOS circuits and the like. In examples, the processing unit can be implemented as a combination of hardware structures and machine-readable commands. The processing unit can, for example, comprise a processor and a memory device that stores machine-readable commands that deliver the described functionalities and result in the performance of the method described herein when they are carried out by the processor. In examples, the memory device can be implemented by any desired, suitable memory devices such as, for example, ROM, PROM, EPROM, EEPROM, flash memory, FRAM (ferro-electrical RAM), MRAM (magneto-resistive RAM), or phase-change-RAM.

All the lists of materials, environmental influences, electrical properties and optical properties listed here are to be seen as exemplary, and not as exhaustive.

Although some aspects have been described in connection with a device, it is clear that these aspects also represent a description of the corresponding method, so that a block or a component of a device is also to be understood as a corresponding method step or as a feature of a method step. Aspects that have been described in connection with a method step, or as such a step, analogously also represent a description of a corresponding block or detail or feature of a corresponding device. Some or all of the method steps can be carried out by a hardware apparatus (or making use of a hardware apparatus), such as, for example, a microprocessor, a programmable computer, or an electronic circuit. In some examples, some or a plurality of the most important method steps can be carried out by such an apparatus.

Depending on particular implementation requirements, examples of the disclosure can be implemented in hardware or in software. The implementation can be carried out making use of a digital storage medium, for example a floppy disk, a DVD, a Blu-ray disc, a CD, a ROM, a PROM, an EPROM, an EEPROM or a flash memory, a hard disk or another magnetic or optical store on which electronically readable control signals are stored that can or do interact together with a programmable computer system in such a way that the respective method is carried out. The digital storage medium can therefore be computer-readable.

Some examples according to the disclosure thus comprise a data carrier that comprises electronically readable control signals that are capable of interacting with a programmable computer system in such a way that one of the methods described herein is carried out.

Examples of the present disclosure can in general be implemented as a computer program product with program code, wherein the program code is effective in carrying out one of the methods when the computer program product is executed on a computer.

The program code can, for example, also be stored on a machine-readable carrier.

Other examples comprise the computer program for carrying out one of the methods described here, wherein the computer program is stored on a machine-readable carrier.

In other words, one example of the method according to the disclosure is thus a computer program that comprises program code for carrying out one of the methods described herein when the computer program is executed on a computer.

A further example of the method according to the disclosure is thus a data carrier (or a digital storage medium or a computer-readable medium) on which the computer program for carrying out one of the methods described herein is recorded. The data carrier, the digital storage medium or the computer-readable medium is typically tangible and/or non-volatile or not temporary.

A further example of the method according to the disclosure is thus a data stream or a sequence of signals that represents or represent the computer program for carrying out one of the methods described herein. The data stream or the sequence of signals can, for example, be configured to be transferred over a data communication connection, for example over the Internet.

A further example comprises a processing device, for example a computer or a programmable logic component, that is configured or adapted to carry out one of the methods described herein.

A further example comprises a computer on which the computer program for carrying out one of the methods described herein is installed.

A further example according to the disclosure comprises a device or system that is designed to transmit a computer program for carrying out at least one of the methods described herein to a receiver. The transmission can, for example, take place electronically or optically. The receiver can, for example, be a computer, a mobile device, a storage device or a similar apparatus. The device or the system can, for example, comprise a data server for transmitting the computer program to the receiver.

In some examples, a programmable logic component (for example a field programmable gate array, an FPGA), can be used to carry out some or all of the functionalities of the methods described herein. In some examples, a field programmable gate array can interact with a microprocessor in order to carry out one of the methods described herein. In general, in some examples, the method is carried out by an arbitrary hardware device. This can be a universally usable hardware such as a computer processor (CPU), or hardware specifically for the method, such as, for example, an ASIC.

The devices described herein can, for example, be implemented making use of a hardware apparatus, or making use of a computer, or making use of a combination of a hardware apparatus and of a computer.

The devices described herein, or any components of the devices described herein, can at least partially be implemented in hardware and/or in software (computer program).

The methods described herein can, for example, be implemented making use of a hardware apparatus, or making use of a computer, or making use of a combination of a hardware apparatus and of a computer.

The methods described herein, or any components of the methods described herein, can at least partially be executed by hardware and/or by software.

The examples described above only represent an exemplification of the principles of the present disclosure. It is obvious that modifications and variations of the arrangements and details described herein will be clear to other specialists. It is therefore intended that the disclosure will only be restricted by the scope of protection of the following patent claims, and not by the specific details that have been presented here with reference to the description and the explanation of the examples.

What is claimed is:

1. A device for determining information regarding a state of a connection of a circuit component that is connected to an output of a regulator via the connection, wherein the circuit component is configured to reduce fluctuations of an output signal of the regulator at the output of the regulator based on the state of the connection, wherein a faulty connection state of the connection includes a poor connection or a disconnection of the circuit component to the output of the regulator, wherein, resultant from the faulty connection state of the connection, the fluctuations of the output signal are higher than the fluctuations of the output signal resultant from a proper connection state of the connection, the device comprising:
  a processing circuit that is configured to:
    measure the output signal to acquire a plurality of measurement signals from the output signal,
    generate a statistical value using the plurality of measurement signals, wherein the statistical value is a measure of fluctuations of the plurality of measurement signals, and thus is a measure of the fluctuations of the output signal at the output of the regulator, wherein each measurement signal of the plurality of measurement signals includes information regarding the output signal of the regulator, and is recorded while a load component generates an electrical load at the output of the regulator,
    compare the statistical value with a limit value to obtain a comparison result, wherein the limit value differentiates the faulty connection state from the proper connection state, and
    determine the information regarding the state of the connection of the circuit component based on the comparison result, wherein the information regarding the state of the connection indicates whether the connection is in the faulty connection state or the proper connection state.

2. The device according to claim 1, wherein the processing circuit is configured to acquire the plurality of measurement signals in response to a change in the electrical load generated by the load component.

3. The device according to claim 1, wherein the load component comprises an analog/digital converter.

4. The device according to claim 3, wherein the processing circuit is configured to receive digital output signals of the analog/digital converter as the plurality of measurement signals.

5. The device according to claim 1, further comprising:
  an interface that is configured to output the information regarding the state of the connection of the circuit component.

6. The device according to claim 1, wherein the statistical value is a measure for a mean deviation of the plurality of measurement signals from a mean value of the plurality of measurement signals.

7. The device according to claim 1, wherein the statistical value is a standard deviation or a variance of the plurality of measurement signals.

8. The device according to claim 1, wherein the processing circuit is configured to generate a binary information signal regarding the state of the connection of the circuit component, wherein the binary information signal indicates whether or not the circuit component is connected to the output by the connection.

9. A circuit device comprising:
  a load component;
  a regulator comprising an output connected to the load component, wherein the regulator is configured to generate an output signal at the output to be provided to the load component;
  a circuit component connected to the output of the regulator; and
  a monitoring device for determining information regarding a state of a connection of the circuit component that is connected to the output of the regulator via the connection, wherein the circuit component is configured to reduce fluctuations in the output signal of the regulator at the output of the regulator based on the state of the connection, the monitoring device comprising a processing circuit that is configured to:
    measure the output signal to acquire a plurality of measurement signals of the output signal,
    generate a statistical value using the plurality of measurement signals, wherein the statistical value is a measure of fluctuations of the plurality of measurement signals, and thus is a measure of the output signal at the output of the regulator, wherein each measurement signal of the plurality of measurement signals includes information regarding the output signal of the regulator, and is recorded while a load component generates an electrical load at the output of the regulator,
    compare the statistical value with a limit value to obtain a comparison result, and
    determine the information regarding the state of the connection of the circuit component based on the comparison result, wherein the information regarding the state of the connection indicates whether or not the connection is faulty,
  wherein the load component is configured to receive the output signal from the regulator and generate the plurality of measurement signals therefrom,
  wherein the processing circuit is configured to receive the plurality of measurement signals from the load component,
  wherein the load component is configured to be switched off and on one or more times to provoke a change in a load, and
  wherein the processing circuit is configured to receive the plurality of measurement signals in response to the load component being switched on one or more times.

10. The circuit device according to claim 9, wherein the circuit component has a capacitive property.

11. The circuit device according to claim 10, wherein the circuit component is a capacitor.

12. The circuit device according to claim 9, further comprising:
  a sensor element that is configured to output a sensor signal, wherein the regulator is a voltage regulator that is configured to generate a regulated reference voltage as the output signal,
  wherein the load component comprises an analog/digital converter that is configured to receive the regulated reference voltage at a first input and to receive the sensor signal at a second input, and
  wherein the processing circuit is configured to receive output signals of the analog/digital converter as the plurality of measurement signals.

13. The circuit device according to claim 9, wherein the circuit device, including the load component, the regulator, the circuit component, and the monitoring device, is implemented as an integrated circuit.

14. A method for determining information regarding a state of a connection of a circuit component that is connected to an output of a regulator via the connection, wherein the circuit component is configured to reduce fluctuations of an output signal of the regulator at the output of the regulator based on the state of the connection, wherein a faulty connection state of the connection includes a poor connection or a disconnection of the circuit component to the output of the regulator, wherein, resultant from the faulty connection state of the connection, the fluctuations of the output signal are higher than the fluctuations of the output signal resultant from a proper connection state of the connection, the method comprising:
  generating an electrical load at the output of the regulator; and
  measuring the output signal to acquire a plurality of measurement signals from the output signal;
  generating a statistical value based on the plurality of measurement signals, each measurement signal of the plurality of measurement signals includes information regarding the output signal of the regulator and is recorded while the electrical load at the output of the regulator is generated, wherein the statistical value is a measure of fluctuations of the plurality of measurement signals and thus is a measure of the fluctuations of the output signal at the output of the regulator;
  comparing the statistical value with a limit value to obtain a comparison result, wherein the limit value differentiates the faulty connection state from the proper connection state; and
  determining the information regarding the state of the connection of the circuit component based on the comparison result, wherein the information regarding the state of the connection indicates whether the connection is in the faulty connection state or the proper connection state.

15. The method according to claim 14, further comprising: transmitting the information regarding the state of the connection of the circuit component.

16. The device according to claim 1, wherein each measurement signal of the plurality of measurement signals is a representation of the output signal at a different time instance.

17. The circuit device according to claim 9, wherein:
  the load component comprises an analog/digital converter that is configured to receive the output signal from the regulator to generate digital output signals,
  the processing circuit is configured to receive the digital output signals of the analog/digital converter as the plurality of measurement signals, and
  the analog/digital converter is configured to be switched off and on to provoke the change in the load, and the processing circuit is configured to receive the plurality of measurement signals in response to the analog/digital converter being switched on.

18. The circuit device according to claim 9, wherein:
  the load component comprises an analog/digital converter that is configured to receive the output signal from the regulator to generate digital output signals,
  the processing circuit is configured to receive the digital output signals of the analog/digital converter as the plurality of measurement signals, and
  wherein the analog/digital converter is configured to be switched off and on multiple times to provoke the change in the load, and the processing circuit is configured to receive at least one of the plurality of measurement signals each time the analog/digital converter is switched on.

19. The circuit device according to claim 12, wherein the analog/digital converter is configured to be switched off and on multiple times to provoke the change in the load, and the processing circuit is configured to receive at least one of the plurality of measurement signals each time the analog/digital converter is switched on.

20. The device according to claim 1, wherein the state of the connection includes one of a presence of a no-fault connection or a presence of a faulty connection, and the information regarding the state of the connection indicates whether the connection is the no-fault connection or the faulty connection.

21. The device according to claim 1, wherein the state of the connection includes one of a presence of a no-fault connection, a presence of a faulty connection, or a presence of a missing connection, and the information regarding the state of the connection indicates whether the connection is the no-fault connection, the faulty connection, or the missing connection.

22. The device according to claim 1, wherein the circuit component is connected directly to the output of the regulator via the connection and directly influences the fluctuations of the output signal based on the state of the connection.

23. The device according to claim 1, wherein each measurement signal of the plurality of measurement signals is a single instantaneous measurement of a voltage of the output signal.

24. The circuit device according to claim 9, wherein the statistical value is a measure for a mean deviation of the plurality of measurement signals from a mean value of the plurality of measurement signals, or
  wherein the statistical value is a standard deviation or a variance of the plurality of measurement signals.

25. The method according to claim 14, wherein the statistical value is a measure for a mean deviation of the plurality of measurement signals from a mean value of the plurality of measurement signals, or
  wherein the statistical value is a standard deviation or a variance of the plurality of measurement signals.

26. A device for determining information regarding a state of a connection of a circuit component that is connected to an output of a regulator via the connection, wherein the circuit component is configured to reduce fluctuations of an output signal of the regulator at the output of the regulator based on the state of the connection, the device comprising:
  a processing circuit that is configured to:
    measure the output signal to acquire a plurality of measurement signals from the output signal,
    generate a statistical value using the plurality of measurement signals, wherein the statistical value is a measure of fluctuations of the plurality of measurement signals, and thus is a measure of the fluctuations of the output signal at the output of the regulator, wherein each measurement signal of the plurality of measurement signals includes information regarding the output signal of the regulator, and is recorded while a load component generates an electrical load at the output of the regulator, wherein the load component comprises an analog/digital converter,
    compare the statistical value with a limit value to obtain a comparison result, and
    determine the information regarding the state of the connection of the circuit component based on the comparison result, wherein the information regarding the state of the connection indicates whether or not the connection is faulty.

27. The device according to claim 26, further comprising:
  a sensor element that is configured to output a sensor signal, wherein the regulator is a voltage regulator that is configured to generate a regulated reference voltage as the output signal,
  wherein the analog/digital converter is configured to receive the regulated reference voltage at a first input and the sensor signal at a second input, and wherein the processing circuit is configured to receive output signals of the analog/digital converter as the plurality of measurement signals.

* * * * *